United States Patent
Hauschild et al.

(10) Patent No.: US 7,518,706 B2
(45) Date of Patent: Apr. 14, 2009

(54) EXPOSURE APPARATUS, A TILTING DEVICE METHOD FOR PERFORMING A TILTED FOCUS TEST, AND A DEVICE MANUFACTURED ACCORDINGLY

(75) Inventors: Jan Hauschild, Eindhoven (NL); Arie Jeffrey Den Boef, Waalre (NL); Martinus Hendrikus Antonius Leenders, Rotterdam (NL); Uwe Mickan, Veldhoven (NL); Roeland Nicolaas Maria Vanneer, Eindhoven (NL); Jacobus Burghoorn, Haelen (NL)

(73) Assignee: ASML Netherlands B.V., Veldhoven (NL)

(*) Notice: Subject to any disclaimer, the term of this patent is extended or adjusted under 35 U.S.C. 154(b) by 811 days.

(21) Appl. No.: 11/020,557

(22) Filed: Dec. 27, 2004

(65) Prior Publication Data
US 2006/0141375 A1    Jun. 29, 2006

(51) Int. Cl.
G03B 27/72    (2006.01)
G03B 24/42    (2006.01)
G03B 27/52    (2006.01)
G03B 27/54    (2006.01)

(52) U.S. Cl. .............. 355/71; 355/53; 355/55; 355/67

(58) Field of Classification Search ............ 355/52, 355/53, 67, 55, 71; 359/637
See application file for complete search history.

(56) References Cited
U.S. PATENT DOCUMENTS

| | | | |
|---|---|---|---|
| 6,297,876 B1 | 10/2001 | Bornebroek | |
| 6,633,390 B2 | 10/2003 | Shiode et al. | |
| 6,701,512 B2 | 3/2004 | Sutani et al. | |
| 6,710,853 B1 | 3/2004 | La Fontaine et al. | |
| 6,728,043 B2 * | 4/2004 | Gruner et al. | 359/637 |
| 6,879,374 B2 | 4/2005 | Van Der Werf et al. | |
| 6,897,940 B2 | 5/2005 | Sogard | |
| 2002/0015158 A1 | 2/2002 | Shiode et al. | |
| 2002/0100012 A1 | 7/2002 | Sutani et al. | |
| 2005/0214657 A1 | 9/2005 | Mitsui | |

FOREIGN PATENT DOCUMENTS

| | | |
|---|---|---|
| EP | 1 223 468 A1 | 7/2002 |
| EP | 1 057 079 B1 | 4/2004 |
| EP | 1 057 079 B9 | 4/2004 |
| JP | 2000-286191 A | 10/2000 |
| JP | 2003-059827 A | 2/2003 |
| JP | 2004-031954 A | 1/2004 |
| JP | 2004-119695 A | 4/2004 |
| JP | 2005-274953 A | 10/2005 |

* cited by examiner

*Primary Examiner*—Alan A Mathews
(74) *Attorney, Agent, or Firm*—Pillsbury Winthrop Shaw Pittman LLP

(57) ABSTRACT

The present invention relates to an exposure apparatus that includes an illumination system for providing a projection beam of radiation, a support structure for supporting a device provided with a pattern, the device serving to impart the projection beam with a pattern in its cross-section; a table for holding a target object, a projection system for projecting the patterned beam onto the target object and a tilting device for providing the projection beam with a tilt. The tilting device is provided substantially in a pupil plane of the projection system.

9 Claims, 6 Drawing Sheets

Prior Art

EXPOSURE APPARATUS, A TILTING DEVICE METHOD FOR PERFORMING A TILTED FOCUS TEST, AND A DEVICE MANUFACTURED ACCORDINGLY

FIELD OF THE INVENTION

The invention relates to a method of performing a tilted focus test and a device manufactured accordingly.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern may be imaged onto a target portion (e.g. including part of, one or several dies) of a substrate (e.g. a silicon wafer) that has a layer of radiation-sensitive material (resist). In general, a single substrate will contain a network of adjacent target portions that may be successively exposed. Conventional lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction), while synchronously scanning the substrate parallel or anti-parallel to this direction.

Although specific reference may be made herein to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, and other devices. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in a track tool that typically applies a layer of resist to a substrate and develops the exposed resist, a metrology tool or an inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to any device that may be used to impart a projection beam with a pattern in its cross-section, such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning device, the design of the lithographic apparatus, and other conditions, such as, for example, whether or not the patterning device is held in a vacuum environment. The support may include mechanical clamping, vacuum, or other clamping techniques, for example, electrostatic clamping under vacuum conditions. The support structure may be a frame or a table, for example, which may be fixed or movable and which may ensure that the patterning device is at a desired position, for example, with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

In order to image the pattern via the lens to the substrate, the layer of resist provided on the substrate should be in the focal plane of the projection system. Focus tests have been developed to test if the substrate is positioned correctly. A test pattern may be provided by a test device to be imaged on the layer of resist. Next, a latent image of the test pattern is made visible by performing, for instance, a post exposure bake. After this, the width of, for instance, a line of the created pattern may be measured using, for instance, a scanning electron microscope. By comparing this width with a previously obtained calibration graph (bossung curve) the defocus may be determined. It will be understood that the width of a line is minimal in the best focus position and will become larger with increasing defocus.

In some places, this text refers to positioning the substrate in the focal plane of the projection system. It is understood that this should be read as positioning the layer of resist provided on the substrate in the focal plane of the projection system.

However, in telecentric focus tests, it is only possible to determine the absolute defocus, but not the relative defocus. The absolute defocus is the distance between the layer of resist and the focal plane, but does not provide information on whether the resist is above or below the focal plane. In other words, the sign of the defocus can not be determined. The relative defocus is the distance between the layer of resist and the focal plane including the sign of the defocus. The relative defocus also provides information about whether the resist is above or below the focal plane. Telecentric focus tests only provide information about the absolute defocus and do not provide sufficient information for correcting the position of a substrate with respect to the projection system, since the sign of the absolute defocus is not known. Other problems exist.

US2002/0015158 A1 discloses a method of detecting focus information based on illumination rays having different main ray incidence directions, which may include the projection beam is tilted. Images of marks are projected through an optical system. A blocking member is provided in the illumination system that can be positioned in the light beam. The blocking member is provided with an aperture to partially block the light beam in such a way that a tilted beam is generated.

In order to determine the lateral shift of the projected mark images with respect to a mark image projected using a non tilted beam, a reference is needed. According to US2002/0015158 A1, this is achieved by superimposing a first and a second image of a single mark on the reticle. The mark is first projected on a substrate using a tilted beam, and next, another projection on the substrate using a non tilted beam is superimposed on the previous one. In between the first and second projections, the blocking member is removed from the light path. The lateral shift is given by the mutual distance between the first and second projected marks on the substrate.

According to a further embodiment of US2002/0015158 A1, a first exposure is carried out using a first blocking member, and a second exposure is carried out using a second blocking member, where the first and second blocking members have apertures that are opposite each other, such that the tilts of the first and second exposure are opposite each other. Thus the sensitivity of the measurement method is doubled.

The tilted focus test as disclosed in US2002/0015158 A1 has some disadvantages. First, the blocking member must specially be designed to take into account the relative position of the marks on the reticle. Thus, the blocking member needs to be designed with dependence on the relative position of the mark on the reticle.

Second, according to US2002/0015158 A1, double exposure is needed to provide a reference, in between which the blocking member needs to be removed or replaced with an other (opposite) blocking member. This is a time-consuming procedure that reduces the throughput of the system.

Third, determining the relative shift of projected marks on top of each other is a rather difficult procedure. Two relatively shifted lines that are projected on top of each other, may result in one single broader line. It is difficult to distinguish the change of line width due to the actual focus conditions and other effects, such as processing, dose variations, etc.

US2002/0100012 A1 describes several ways to create a tilted beam for use in a tilted focus test. A tilted beam is obtained by blocking certain diffraction orders. The blocking can, for instance, be achieved by positioning a pellicle under the mask. A frame member holding the pellicle is then used to block a diffraction order of the mark. According to an alternative, part of the normally transparent part of the pellicle can be non-transparent, to block certain diffraction orders.

The options presented in US2002/0100012 A1 have several disadvantages. Using the frame member to create a tilted beam is rather cumbersome and can only be used if the angle under which the diffraction orders are emitted by the mark and the distance between the frame member and the mark are within certain limits with respect to each other. Using the normally translucent pellicle to block certain diffraction orders requires a specially adapted pellicle for each mark. The overall performance of the pellicle will decrease as a result of the non-transparent parts having a negative effect on the overall performance of the system. Also, pellicles can not be used in applications using (extreme) ultraviolet radiation beams, as will be understood by a skilled person.

SUMMARY

The invention provides tilted focus tests. In such tilted focus tests, an image of the test pattern may be projected under an angle, such that defocus results in both a blurred image of a test device and also in a lateral shift of the position of the imaged test device. Such tilted focus tests may use devices to create a tilted beam, such as a wedge that is translucent for the light used or a transmissive test device that is provided with a pattern that creates a diffraction pattern in which the minus one diffraction order is cancelled out, for example.

In order to manufacture increasingly smaller lithographic devices having increasingly smaller dimensions, the wavelength of the radiation is preferably chosen as small as possible. The use of extreme ultraviolet radiation, e.g. in a range of 5-20 nm, offers great advantages. It is, however, known that radiation having a relatively small wavelength, such as EUV radiation, does not easily penetrate through matter. Therefore, prior art solutions described herein to create a tilted beam cannot be used for EUV radiation. In principle, it is possible to manufacture a reflective version of the conventional transmissive test devices provided with a pattern. However, this requires an accuracy that is difficult to obtain with current technology, as will be further explained below.

The invention provides a lithographic apparatus that overcomes at least one of the above mentioned problems. The invention also provides a lithographic apparatus that may be used in combination with EUV radiation. According to an embodiment of the invention, there is provided a lithographic apparatus having a tilting device for providing the projection beam with a tilt, wherein the tilting device is provided substantially in a pupil plane in the projection system.

By providing the device for tilting the projection beam in a pupil plane in the projection system, the implemented device acts on the features of the pattern it is designed for, regardless of their relative positions on the reticle. So there is no need to adjust the position of the device for each reticle position.

It will be understood that the device may be brought into position manually, but may also be brought into position in an automatic way. The device according to the invention is therefore easy to implement, especially in case EUV radiation is used. Moreover, is the invention may be a cheap solution that could be applied for all masks which contain the targeted structures.

According to a further aspect, the invention relates to a tilting device for providing a projection beam with a tilt for use in an exposure apparatus that includes an illumination system for providing a projection beam of radiation, a support structure for supporting a device provided with a pattern, the device serving to impart the projection beam with a pattern in its cross-section, a table for holding a target object, and a projection system for projecting the patterned beam onto the target object, wherein the exposure apparatus further includes a tilting device for providing the projection beam with a tilt.

According to a further aspect, the invention relates to a method for performing a tilted focus test, including providing a target object, providing a projection beam of radiation using an illumination system, providing a device provided with a pattern to impart the projection beam with a pattern in its cross-section, projecting the patterned beam of radiation onto the target object using a projection system, using a tilting device for providing the projection beam with a tilt, the tilting device being substantially in a pupil plane in the projection system, determining a lateral shift of the projected patterned beam, and determining from the lateral shift a defocus of the target object with respect to the projected patterned beam.

According to a further aspect, the invention relates to a device manufactured according to the method as described above.

BRIEF DESCRIPTION OF THE DRAWING

Embodiments of the invention will now be described, by way of example only, with reference to the accompanying schematic drawings in which corresponding reference symbols indicate corresponding parts, and in which.

DETAILED DESCRIPTION

Figure 1:
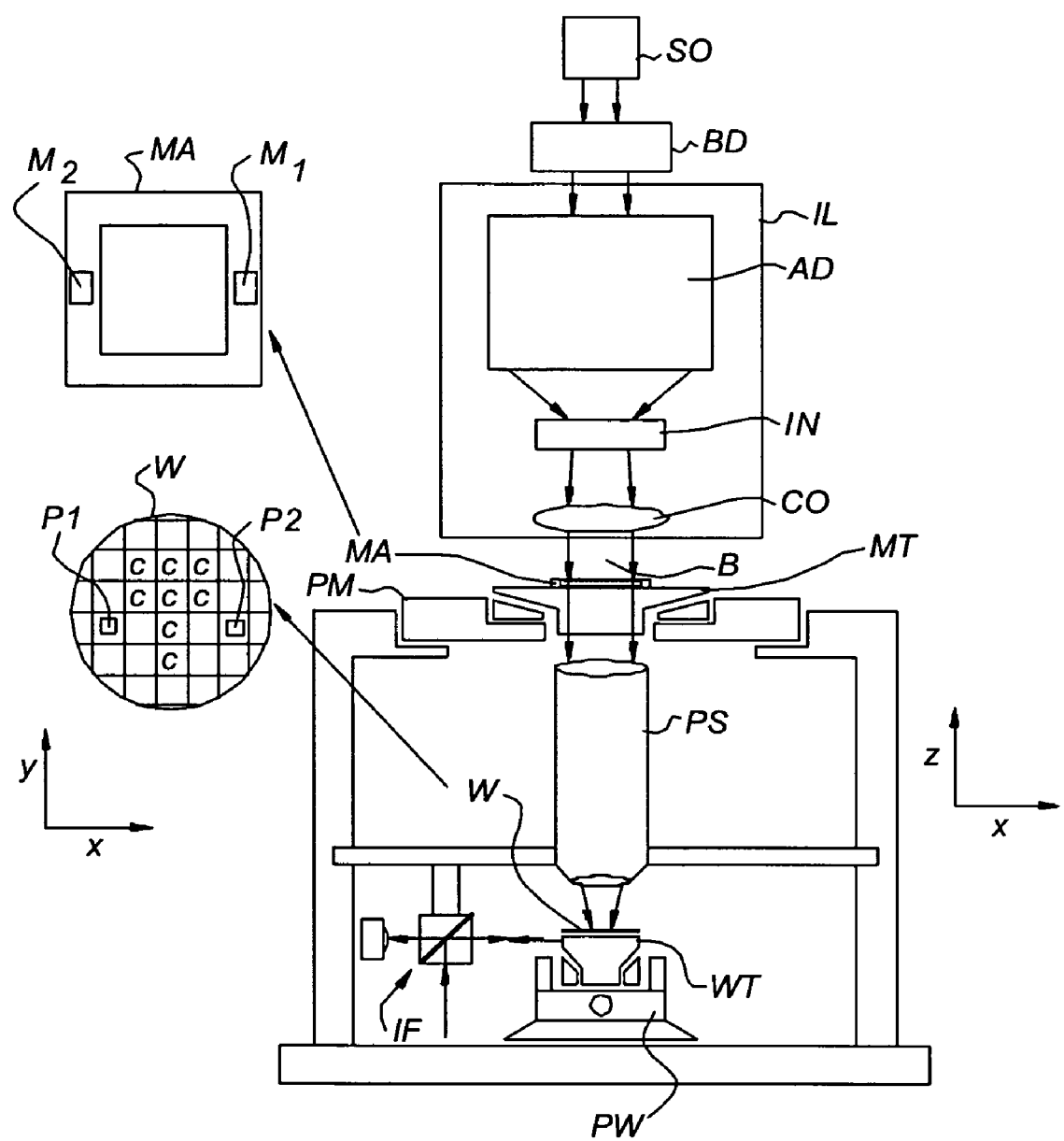
FIG. 1 depicts a lithographic apparatus according to an embodiment of the invention.

FIG. 1 schematically depicts a lithographic apparatus according to one embodiment of the invention. The apparatus includes:

an illumination system (illuminator) IL configured to condition a radiation beam B (e.g. UV radiation, EUV radiation, or other radiation beam).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as, for example, whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Any use of the terms "reticle" or "mask" herein may be considered synonymous with the more general term "patterning device."

The term "patterning device" used herein should be broadly interpreted as referring to any device that may be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions. The tilted mirrors impart a pattern in a radiation beam which may be reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are known in the art for increasing the numerical aperture of projection systems. The term "immersion" as used herein is not intended to suggest that a structure, such as a substrate, must be submerged in liquid, but rather means that liquid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source may not be considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example, when the source is a mercury lamp. The source SO and the illuminator IL, together with the beam delivery system BD if used, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam to have a desired uniformity and intensity distribution in its cross-section.

The radiation beam B may be incident on the patterning device (e.g., mask MA), which may be held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT may be moved accurately, so as to position different target portions C in the path of the radiation beam B. Similarly, the first positioner PM and another position sensor (which is not explicitly depicted in FIG. 1) may be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks, as illustrated, occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT may be kept essentially stationary, while an entire pattern imparted to the radiation beam may be projected onto a target portion C at one time (i.e. a single static exposure). The substrate table WT is then shifted in the X and/or Y direction so that a different target portion C may be exposed. In step mode, the maximum size of the exposure field may limit the size of the target portion C imaged in a single static exposure.

2. In scan mode, the mask table MT and the substrate table WT may be scanned synchronously while a pattern imparted to the radiation beam may be projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT may be kept essentially stationary holding a programmable patterning device, and the substrate table WT may be moved or scanned while a pattern imparted to the radiation beam is projected onto a target portion C. In this mode, generally a pulsed radiation source is employed and the programmable patterning device is updated, as required, after each movement of the substrate table WT or in between successive radiation pulses during a scan. This mode of operation may be readily applied to maskless lithography that utilizes programmable patterning device, such as a programmable mirror array of a type as referred to above.

Combinations and/or variations on the above described modes of use or entirely different modes of use may also be employed.

Figure 2A:
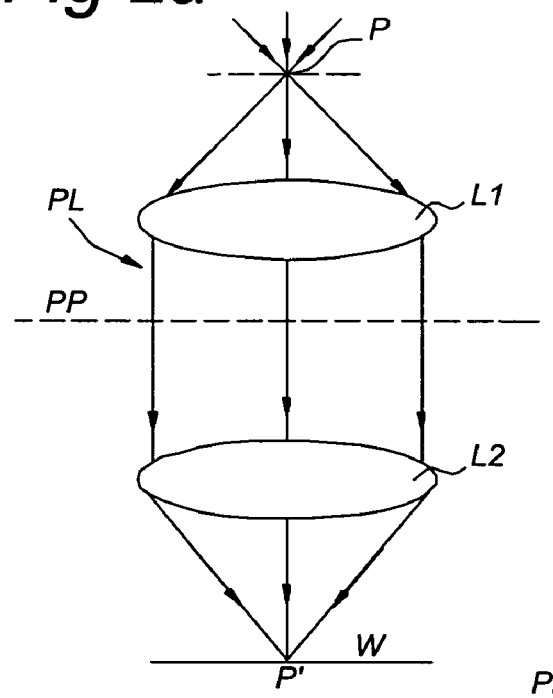
FIGS. 2a and 2b depict a conventional telecentric focus test.
Figure 2B:
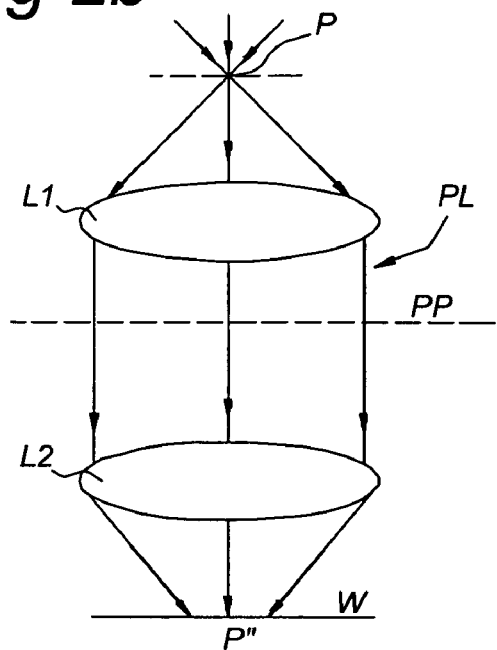

FIGS. 2a and 2b schematically depict a simple and straight-forward prior art focus test. FIG. 2a shows telecentric projection system PL comprising a first lens L1 and a second lens L2. In between the first lens L1 and the second lens L2 is a pupil plane PP. It will be understood that, for reasons of simplicity, only two lenses are depicted in FIG. 2, but that projection system PL may include any number of lenses. A test pattern provided on a test device P may be imaged via projection system PL on the surface of a substrate W. The test device P may be a test device P being provided on a reticle MA. It may be a test device P that is specially added to the reticle MA for test purposes. Alternatively, it may be formed as part of the pattern on the reticle MA used for producing chips. The reticle MA may also be a reticle MA that is specially used for performing focus tests.

In the situation depicted in FIG. 2a, the substrate W is substantially in the focal plane of the projection system PL and test device P is imaged as a sharp test structure P'. FIG. 2b shows the same components, but now substrate W is positioned above the focal plane of the projection system PL. Test structure P is now projected as a blurred test structure P"'. It will be understood that the amount of blurring depends on the amount of defocus. However, the amount of blurring does not depend on the direction of the defocus. If substrate W would have been positioned a similar distance below the focal plane of the projection system PL, the same amount of blurring would have been generated. Based on the test structure P"', it may be impossible to determine whether the substrate W is above or below the focal plane of the projection system PL.

The amount of blurring may be measured by measuring the width of, for instance, a line of the created pattern after developing using for instance a scanning electron microscope (SEM). The behavior of the width with varying defocus should be known from a previously obtained bossung curve. This behavior may be relatively flat and thus insensitive for variations in the defocus. The behavior is quadratic, so the sensitivity around best focus is substantially zero.

Figure 3A:
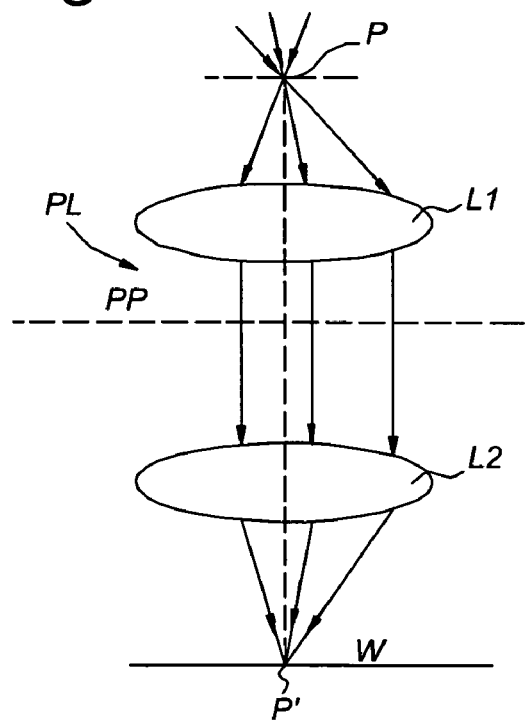
FIGS. 3a and 3b depict a conventional tilted focus test.
Figure 3B:
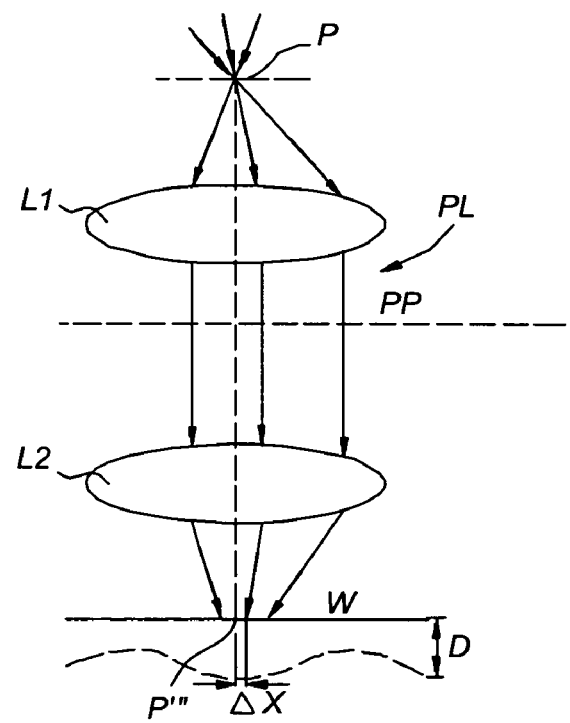
Figure 4:
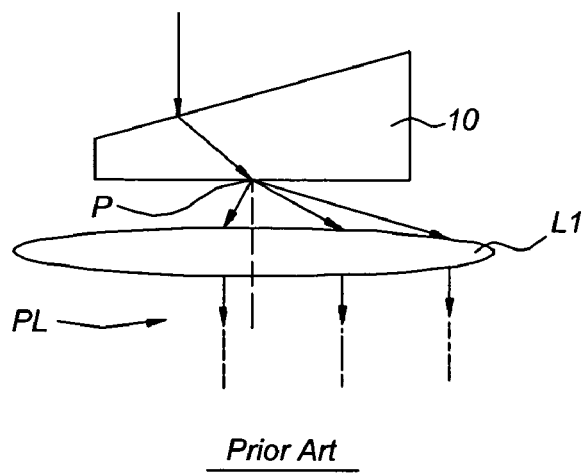
FIG. 4 depicts a conventional wedge for providing a tilted beam.

Tilted focus tests have been developed, as is schematically depicted in FIGS. 3a and 3b. These tilted focus tests are designed to provide a linear behavior and a sufficiently high sensitivity. The same reference symbols refer to the same items. The image beam used for projecting an image of the test structure provided on the test device P on the surface of the substrate W is tilted. FIG. 3a shows imaging of a test device P through the projection system PL, where the substrate W is in the focal plane of the projection system PL. FIG. 3b depicts a situation in which the substrate W is above the focal plane of the projection system PL and it can been seen that the test device P is now imaged as a blurred and laterally shifted test structure P'". The center of the blur P'" is laterally shifted by an amount Δx with respect to the position it would have had in case the substrate W would have been in the focal plane of the projection system PL, as depicted in FIG. 3a. As a result, the lateral displacement Δx depends on the amount of defocus D. The direction of the lateral shift Δx (in the positive or negative x direction) provides information about the direction of the defocus. In case the lateral shift is in the positive x-direction, the substrate W is above the focal plane of the projection system PL, and vice versa. Based on such a tilted focus test, it is thus possible to measure and, as a further step, also correct the relative position of the substrate W and the projection system PL. In principle, it also may be possible to adjust the setting of the projection system. Several methods are known to create such a tilted beam. FIG. 4 depicts a wedge 10 that provides the image beam with a tilt and shifts the complete intensity distribution. Such a wedge 10 may, for instance, be made of quartz. The wedge 10 may, for instance, be positioned on a reticle MA (not shown in FIG. 4) on which the test structure P is positioned.

Figure 5:
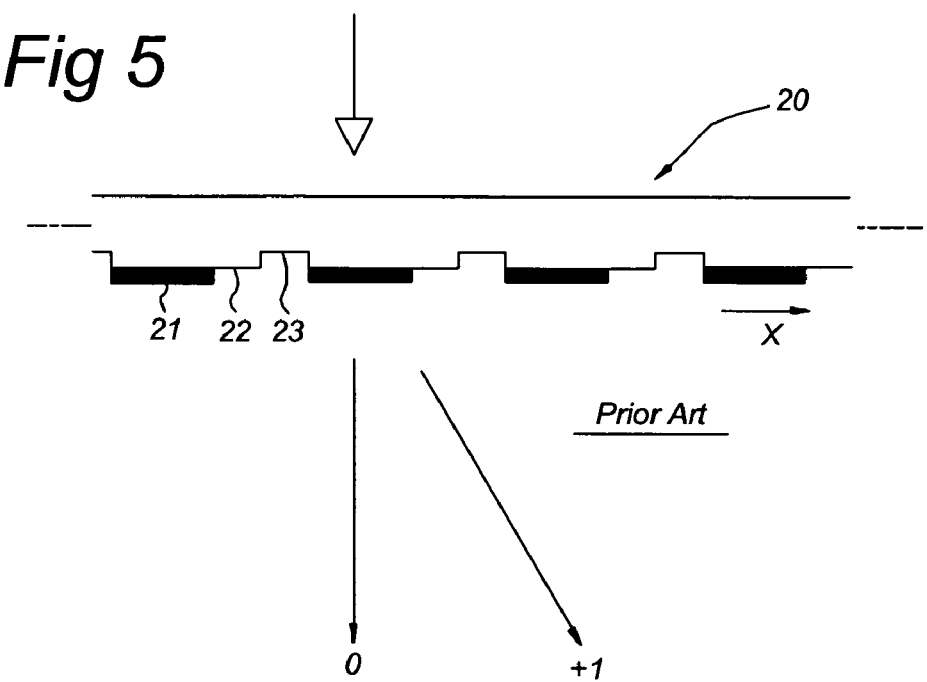
FIG. 5 depicts a conventional pattern for providing a tilted beam.

FIG. 5 depicts an alternative way to create a tilted beam (see also U.S. Pat. No. 6,710,853 B1). FIG. 5 schematically depicts a cross section of a test device 20 that may be made of quartz. The focus test device 20 has a pattern with chrome parts 21, that block impinging light. In between the chrome parts 21, a phase step is etched in the quartz. This phase step may be formed by a first part 22 and a second part 23. The height of the first part 22 relative to the height of the second part 23 is chosen such that a phase shift of 90° is provided at the used wavelength. As a result, light that passes through the first part 22 has a 90° phase difference with respect to light that passes through the etched second part 23. The lengths in the x-direction of the chrome parts 21, the first parts 22 and the second parts 23 may be in a proportion of 2:1:1.

Light that passes through the test device 20 is diffracted. It can be shown that the wave fronts of the minus first orders resulting from the first part 22 and the second part 23 have a 180° phase difference and cancel each other. The zero orders have 45° phase difference and are slightly weakened, while the plus first orders have a 0° phase difference. Therefore, only the zero and the plus first order are present, while the minus first order is not present. This also results in a tilted beam that can be used for performing tilted focus test.

It will be understood by a person skilled in the art that the solutions described with reference to FIGS. 4 and 5 can not easily be adopted for use in EUV applications. If wedge 10 is made of quartz, it cannot be used for EUV application since it does not pass EUV radiation. The test device 20, as depicted in FIG. 5, is of a transmissive type and is therefore also unsuitable for use in EUV applications. In principle, it could be possible to create a reflective version of the test device 20. However, since the wavelength of EUV is rather small (for instance 13 nm), the 90° phase step should be obtained by providing a height difference in the focus test pattern of 13/8 nm for a reflective mask, which requires an accuracy in the manufacture of the test device that is rather difficult to obtain. US2002/0015158 A1 describes a different way of performing a tilted focus test by providing one or two blocking members in the illumination system. However, this approach has a number of disadvantages as already discussed above.

Figure 6A:
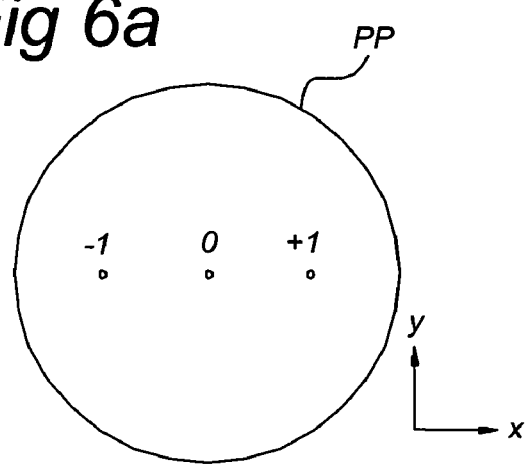
FIGS. 6a, 6b and 6c depict a first embodiment of the present invention.
Figure 6B:
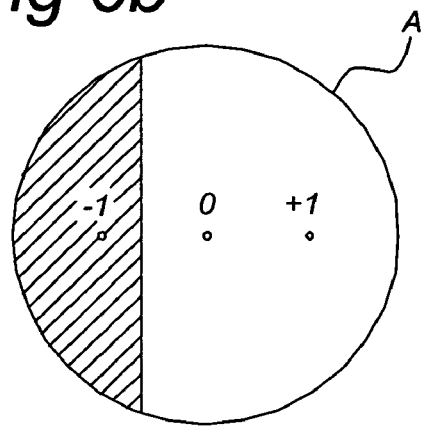

An embodiment of the present invention will now be explained with reference to FIGS. 6a, 6b and 6c. FIG. 6a depicts the pupil plane PP comprising the zero order and the plus and minus first diffraction order of a diffraction pattern generated by a test device. Such a test device may be a grating having a certain periodicity, but may also be a single line, having a certain width. It will be understood that a single line will generate blurry diffraction orders as compared to a grating.

The pupil plane PP may be present in the projection system PL (not shown) as already described with reference to FIGS. 2a and 2b. It will be understood that the pupil plane PP may also include a different number of orders, depending on the numerical aperture NA of the projection system PL and the characteristics of the test device used.

According to the invention, a tilted beam may be created by providing a blocking member A in the pupil plane PP that blocks, for instance, the minus first diffraction order. The blocking member A comprises parts that are non translucent and parts that are translucent for the type of radiation used. Such a blocking member A is shown in FIG. 6b. The non translucent parts are indicated with the hatched pattern. As a result of this, a tilted beam may be created that can advantageously be used in tilted focus tests.

Figure 6C:
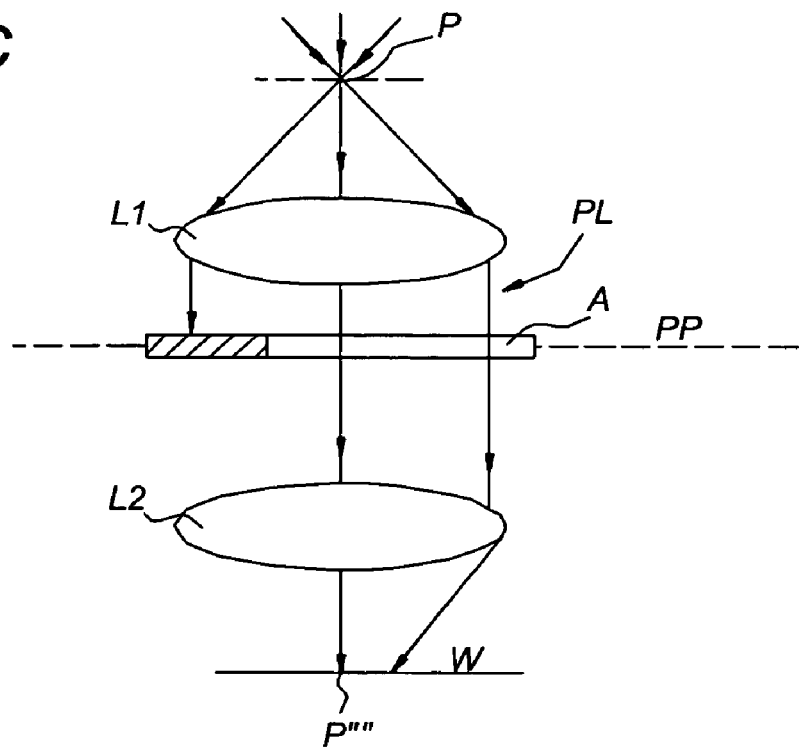

FIG. 6c schematically depicts how the blocking member A is positioned in the pupil plane PP of the projection system PL. It may be seen that a tilted beam is generated that can be used to perform a tilted focus test as described above.

Such a blocking member can advantageously be used in applications using a relatively small wavelength, such as EUV radiation. The non translucent parts may be made of any material suitable for blocking the radiation used, while the translucent parts can simply be formed by openings in the blocking member.

It will be understood that the tilted focus test, as presented here, may be carried out in the projection system PL and not in the illumination system, since no diffraction orders are present there.

A method will now be described for performing a tilted focus test according to an embodiment of the invention. In order to determine the relative defocus, i.e. the distance between the layer of resist and the focal plane and the sign thereof, first a calibration graph is obtained. A calibration graph may be obtained by imaging test devices provided with a pattern on the layer of resist provided on a substrate W of which the defocus is known. Next, the lateral shift (e.g. Δx, FIG. 3b) may be determined. In order to determine the lateral shift, a reference is needed which can be provided by imaging a test device using a non tilted beam. The lateral shift may then be determined by measuring the distance between the imaged test device that is imaged using a tilted radiation beam and the imaged test device that is imaged using a non tilted beam. If the distance between the tiled image and non-tilted test devices is known in the focal plane, then the lateral shift, including the direction of the lateral shift, may be measured by using measurement techniques that are known to a person skilled in the art, such as using a SEM, an off-axis alignment system (see U.S. Pat. No. 6,297,876 B1) or an on-axis alignment system, among other systems.

It will be understood that the magnification factor provided by the projection system PL between the reticle level and the substrate level should be taken into account when comparing distances at reticle level and substrate level. However, by using a calibration step, such as obtaining a calibration graph as explained below, the magnification factor is automatically taken into account.

A calibration graph can now be obtained by performing a sequence of focus test measurements while varying the defocus. Measurements may be done with a defocus −0.300 µm, −0.150 µm, 0 µm, +0.150 µm and +0.300 µm. For each value of the defocus, the lateral shift may be determined in the x and y-direction, where the x and y-direction are perpendicular with respect to each other and are both parallel with the resist layer on the substrate W. The lateral shift may be determined using techniques referred to above. Due to the tilt of the measurement beam, the behaviour of the lateral shift with focus will be mainly linear.

The focus and defocus in the x-direction may be different from the focus and defocus in the y-direction. The diffraction orders of a test pattern that extend in the x-direction, as measured from a line that extends in the y-direction, will be on the x-axis in the pupil plane PP, as depicted in FIG. 6a. In contrast, the diffraction orders of a test pattern in the y-direction, as measured from a line in the x-direction, may be positioned in the y-direction (not shown in FIG. 6a). Since the lenses used in the projection system PL are not perfect, the focal distance in the x and y direction may not be exactly similar. In order to obtain optimal results, both values may be averaged to reduce noise and the position of the substrate table WT may be adjusted based on this averaged value.

Since the method as described here may be used to determine the defocus in x and y directions, it will be understood that also lens aberrations may be derived from this. For instance, based on the determined defocus in the x and y directions, astigmatism and astigmatism curvature, which may be corrected for in the projection system PL may be obtained.

Figure 7:
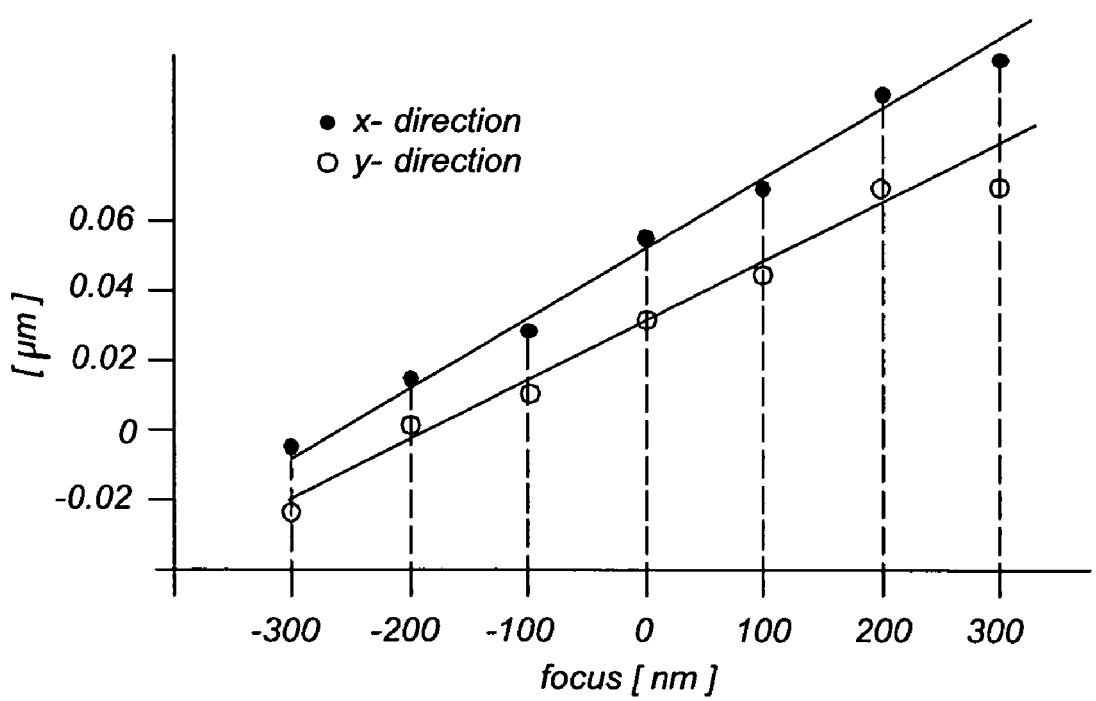
FIG. 7 depicts a calibration graph according to the present invention.

The results of these measurements may be plotted in a graph as schematically shown in FIG. 7. Two calibration curves, i.e. one for the x-direction and one for the y-direction, may be obtained by plotting lines through the obtained measurement points. This may be done using any kind of interpolation technique. In the example shown in FIG. 7, a straight line is plotted through the measured points using a least squares method or other methods. Higher order polynomials may be plotted through the measured points.

After the calibration curve is determined, the calibration curve can be used to determine the focus of imaged test devices. The calibration curves may be used for focus tests performed thereafter. The obtained calibration curve can be used if the following conditions are met:

1) the lithographic projection apparatus remains stable, otherwise recalibration is needed after a certain time period, and 2) conditions remain the same as during calibration, such as same resist, illumination settings, and other conditions.

The calibration curve may be used for performing actual focus tests according to the invention. The focus test according to the invention may be performed on the entire surface of a substrate W, but may also be used to determine the focus on specific areas of the substrate W (e.g. scribe lanes).

The focus test may be used to test the focus on the entire surface of a substrate W. This may be done by printing test patterns over the entire layer of resist provided on the substrate W while positioning the substrate W according to a height map obtained by a level sensor. Such a height map may include information about the height of the substrate W on different x,y locations on the substrate W. Based on such a determined height map, an optimal position of the substrate W with respect to the projection system PL may be computed. Since the substrate W is not a flat object and may include local deformations, it may not be possible to have the entire exposure area within the focal plane.

The actual obtained focus may be determined by projecting test patterns provided on test devices to the entire substrate. After the substrate W is exposed and the test patterns are developed, the actual obtained focus may be determined and a focus map may be generated from the entire substrate surface. Such a focus map comprises data representing the actual obtained (de-)focus on different x,y locations on the substrate W. This may be performed by measuring the lateral shift of each printed test pattern using techniques referred to above and determining the defocus using the calibration graph as shown in FIG. 7.

After this, the resist may be removed and a new layer of resist may be applied to the substrate W (none destructive), which may be used for exposing the actual pattern on the substrate W. The obtained focus map can then be used to project the actual pattern more accurately on the substrate W.

In an alternative embodiment, the test pattern provided on the test device may be projected on scribe lanes. These scribe lanes may be located outside the target portions C on which the actual product patterns are printed. This technique allows a combination of "real" exposure and monitoring at the same time and there is no need to remove the resist as in the example above.

In both cases, the test pattern provided on the test device is imaged in the layer of resist, and next the substrate W may be removed from the lithographic apparatus and transported into a track. Inside the track, the printed test patterns, that are still latent, may be made detectable by performing a post exposure bake or other technique. After this, the lateral shift of the printed test patterns may be determined using techniques referred to above.

As described above, a reference may be needed to determine the lateral shift. According to alternative embodiments discussed below, no separate reference is needed.

Figure 8A:
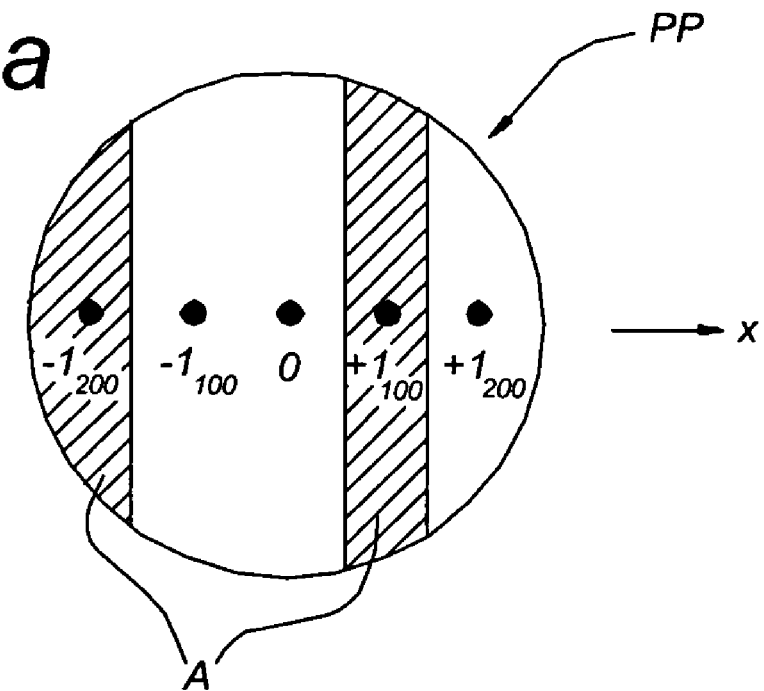
FIGS. 8a and 8b depict an alternative embodiment of the present invention.

FIG. 8a depicts a schematic view of a pupil plane PP and another blocking member A. The pupil plane PP shows a diffraction pattern generated by a test device provided with a test pattern that comprises a 100 nm line (i.e. having a width of 100 nm) and a 200 nm line of which the mutual distance is known. The 100 nm and the 200 nm lines may be projected with diffracted beams on the substrate W. The pupil plane PP therefore shows a positive and a negative first order for the 100 nm line and a positive and negative first order for the 200 nm line. The blocking member A is designed in such a way that the positive first order of the 100 nm line and the negative first order of the 200 nm line are blocked. The negative first order of the 100 nm line and the positive first order of the 200 nm line are not blocked. As a result of this, the tilt and thus the lateral shift due to defocus of the 100 nm line and the 200 nm line are opposite. The fact that these shifts are opposite increases the sensitivity.

A blocking member as shown in FIG. 8, makes it possible to project a first and second portion of a marker using opposite tilts. The mutual distance between the projected first and second portions are used to determine the lateral shift and the defocus. According to this embodiment, no reference may be needed.

Of course, the 100 nm and the 200 nm lines are just examples. In principle, structures are preferred which have a first order in the pupil plane (which can be eliminated) and have no second order in the pupil plane. Such structures may be formed by a grating having a certain periodicity. The structure could be formed using a first grating having a plurality of lines having a thickness of 100 nm that are positioned at intervals of 100 nm and a second grating having a plurality of lines having a thickness of 200 nm that are positioned at intervals of 200 mm.

Figure 8B:
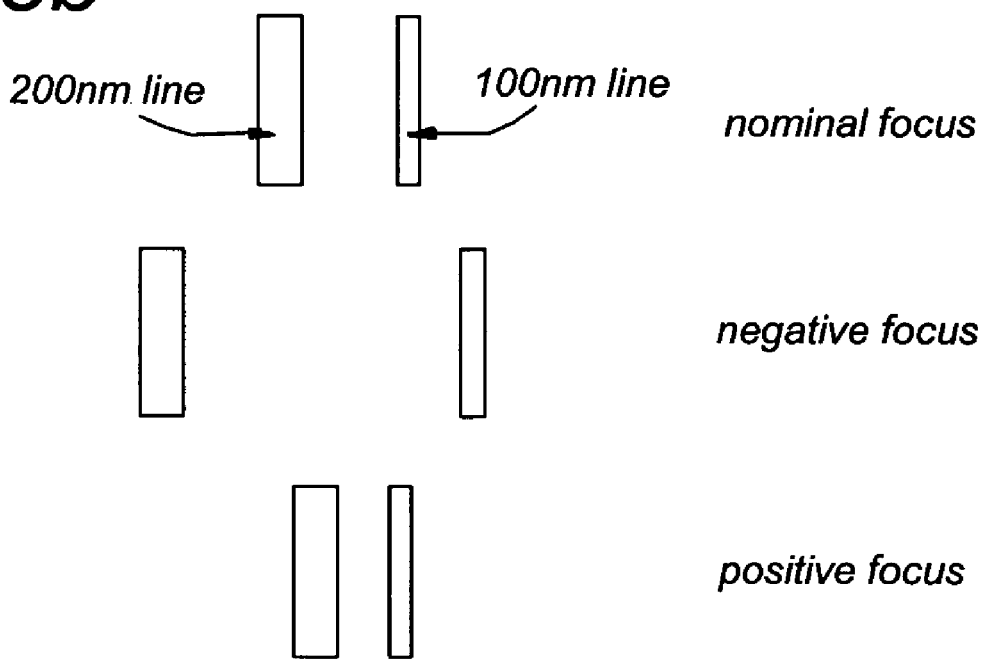

FIG. 8b schematically shows the relative position of the projected 100 nm line and the 200 nm line. The upper pair depicts their relative position in the focal plane. The middle pair depicts the relative position of the 100 nm and the 200 nm line in negative focus, which means that the distance between the substrate W and the projection lens PL is too big. In that case, the 100 nm line may be shifted to the right, while the 200 nm line may be shifted to the left, since the beam of the 100 nm and the 200 nm line are tilted oppositely. It can be seen from FIG. 8b that the lateral shift of the 200 nm line is bigger than the lateral shift of the 100 nm line, since the beam used to image the 200 nm line has a higher tilt than the beam of the 100 nm line, as may be understood from FIG. 8a. Their mutual distance is thus increased. In case the focus is positive, the mutual distance decreases, as is shown by the lower pair of FIG. 8b. According to this embodiment, no reference needs to be provided by imaging a test pattern using a non tilted beam since the defocus can be deduced from measuring a distance within one imaged test pattern. The amount of defocus may be determined by projecting a single test pattern and performing measurements to only that single test pattern. This means that there is no need to apply a double exposure, so possible influences from double exposures, such as overlay errors, are not present. According to this embodiment, the measurement of the lateral shift is also more accurate. This may be caused by the fact that the variation in the mutual distance between the imaged 100 nm and 200 nm line may be bigger, due to their opposite shifts, than the lateral shift of an imaged test pattern using a tilted beam with respect to a test pattern imaged using a non tilted beam.

The general idea of the embodiment as described with reference to FIGS. 8a and 8b is that the test pattern should be provided with a first portion and a second portion, where the first and second portions are so designed that their corresponding diffraction orders in the pupil plane are not overlapping. This means that it is possible to provide a blocking member that blocks the positive diffraction orders that correspond to the first portion and the negative diffraction orders that correspond to the second portion. As a result of this, the first portion and the second portion may both be tilted, but they may be tilted in opposite directions. It will be understood that the mutual distance between the projected first and second portion can now be used as a measure for the defocus. According to this embodiment, no reference mark or reference exposure is needed.

In principle, it is also possible to use a single pattern that has two diffraction orders in the pupil plane (−2, −1, 0, +1 and +2) and block these asymmetrically (−2 and +1). However, the sensitivity of such a measurement may be relatively low.

The invention may also be used in situation in which off axis illumination is used, as long as more than two diffraction orders are used for imaging. For instance, in case two diffraction patterns are generated of which the zeroth and first positive order of the first diffraction pattern are within the pupil plane and the first negative order of the second diffraction pattern is superimposed on the zeroth order of the first diffraction pattern and the zeroth order of the second diffraction pattern is superimposed on the first positive diffraction order of the first diffraction pattern, the blocking member may be arranged to block the first negative order of the first diffraction pattern and the zeroth order of the second diffraction pattern. This may create a tilted beam that still includes a zeroth and a first positive diffraction order and thus includes sufficient information to reconstruct the original image at the focal plane.

According to an alternative embodiment a blocking member $A_{x,y}$ and a test device $P_{x,y}$ could be used that are arranged to determine the defocus in the x and y direction simultaneously. Such a test device $P_{x,y}$ should be provided with a first test pattern $P_x$ extending in the x direction and a second test pattern $P_y$ extending in the y direction. The blocking member A should be designed to block certain diffraction orders of the first test pattern $P_x$ and certain diffraction orders of the second test pattern $P_y$.

Figure 9:
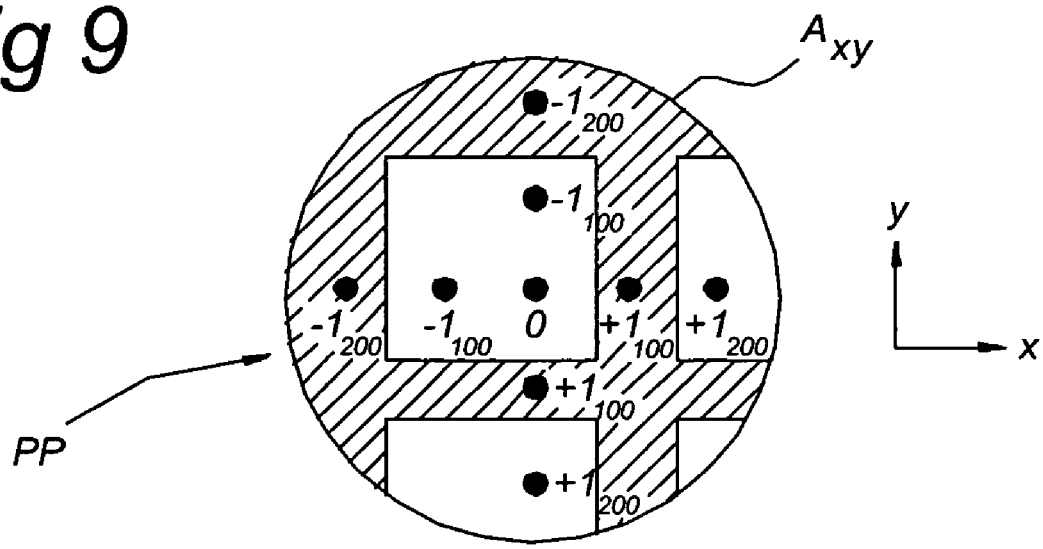
FIG. 9 depicts a further embodiment of the present invention.
Figure 10:
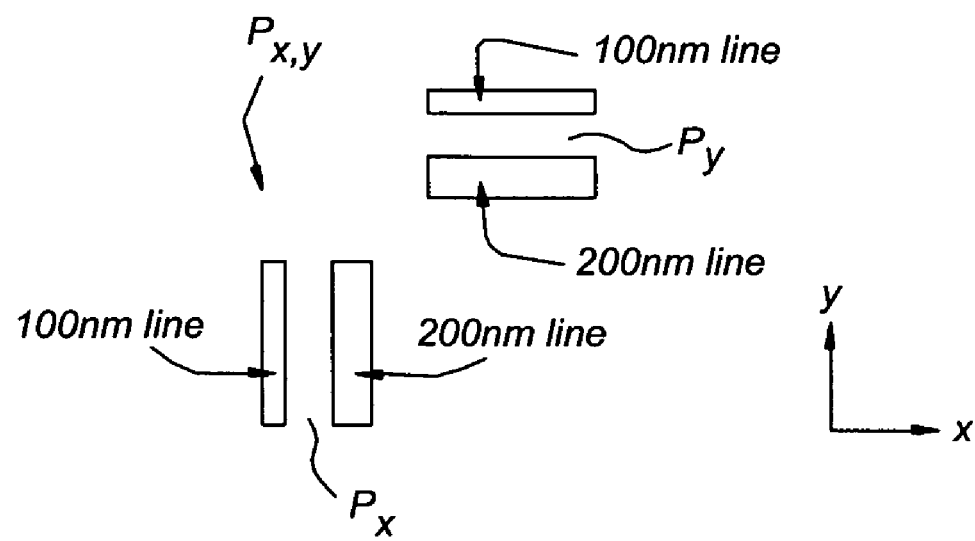
FIG. 10 depicts a test pattern according to a further embodiment of the present invention.

FIG. 9 shows such an alternative embodiment in which blocking member $A_{x,y}$ may be used in both the x and y direction. This embodiment could be used in combination with the embodiment discussed above, using a 100 nm and a 200 nm line, so that no reference is needed. In that case, the test pattern $P_{x,y}$ could comprise a 100 nm and a 200 nm line in the x direction and a 100 nm and 200 nm line in the y direction, forming the first test pattern $P_x$ and the second test pattern $P_y$, respectively, as is shown in FIG. 10. In principle, testing in any direction is possible.

The blocking member $A_{x,y}$ of FIG. 9 is designed in such a way that it blocks the positive first diffraction orders of the 100 nm line in the x and y direction, and it further blocks the negative first diffraction orders of the 200 nm line in the x and y direction. It will be understood that such a blocking member A can be used to determine the defocus for a test pattern in the x and the y direction, while no reference is needed.

Such a pattern can be used to perform a focus test in the x and y directions simultaneously. This allows taking into account the different lens characteristics in the x and y direction. This allows determining the defocus for both patterns. These values could, for instance, be averaged and the averaged value could be used to adjust the position of the substrate table with respect to the projection lens. This increases the accuracy.

The projection system PL is preferably provided with structure that allow an easy positioning and removal of the blocking member A, $A_{x,y}$ according to the invention. The projection system PL could for instance be provided with a positioning device that is arranged to hold the blocking member A, $A_{x,y}$ and move it to a first position where it is in the path of the projection beam and to a second position where it is outside the path of the projection beam. The positioning device could further be arranged to accurately adjust the position of the blocking member A, $A_{x,y}$ at the first position, for instance, by translating and/or rotating the blocking member A, $A_{x,y}$.

The blocking member as discussed above may be provided by a separate blocking member that is specially provided for carrying out the invention. However, the blocking member may also serve another purpose. For instance, the blocking member may be formed by numerical aperture stop mechanism, that may be available in conventional lithographic machines. Such a numerical aperture stop mechanism may shift blades in the pupil plane of the lithographic machine to adjust the numerical aperture of the lithographic machine.

It will further be understood that other blocking members may be conceived. The blocking member may, for instance, be formed by a plurality of blades, like the slats of a Venetian blind, that each can be tilted individually to block the radiation beam. The blocking member may also be formed by a CCD (light valve).

The blocking member may be formed by any known type of patterning device. Examples of patterning devices that may be used to be used as blocking members include masks, programmable mirror arrays, and programmable LCD panels, among other patterning devices. An example of a programmable mirror array employs a matrix arrangement of small mirrors, each of which can be individually tilted so as to reflect an incoming radiation beam in different directions; in this manner, the reflected beam is patterned.

It will be understood that although embodiments described above refer to the use of lenses, the invention may also very well be applied in lithographic apparatus using mirrors instead of lenses. The invention may very well be used in machines using EUV radiation. The blocking members according to the invention may be used for EUV applications. The non translucent parts can be made of any kind of material, since all materials block EUV radiation and the non translucent parts can easily be constructed as openings in the blocking member, not containing any material. The blocking member should of course be suitable for use in low pressure or vacuum environments.

The invention could also be used to perform calibrations for a lithographic apparatus or could be used as an in-line feedback system, to be used in automated process control loops.

It will further be understood that although all embodiments described above all refer to the use of lithographic apparatus, the invention can also advantageously be used for all kinds of exposure apparatus in which a patterned beam is projected onto a target object and in which tilted focus test are performed.

Other embodiments, uses and advantages of the invention will be apparent to those skilled in the art from consideration of the specification and practice of the invention disclosed herein. The specification should be considered exemplary only, and the scope of the invention is accordingly intended to be limited only by the following claims.

What is claimed is:

1. An exposure apparatus comprising:
   an illumination system for providing a projection beam of radiation;
   a support structure for supporting a patterning device that is provided with a pattern, the patterning device serving to impart the projection beam with a patterned cross-section;
   a table for holding a target object;
   a projection system for projecting the patterned beam onto the target object; and
   a tilting device for tilting the projection beam away from an optical axis of the illumination system, wherein the tilting device is provided substantially in a pupil plane of the projection system.

2. The exposure apparatus according to claim 1, wherein the tilting device comprises a blocking member that includes at least a translucent part and at least a non translucent part, wherein the non translucent part is configured to block part of the patterned beam.

3. The exposure apparatus according to claim 1, wherein the projection beam is diffracted into a plurality of diffraction orders and the plurality of diffraction orders are provided in different diffraction locations in the pupil plane of the projection system and wherein the tilting device is configured to block predetermined diffraction orders of the patterned projection beam to create the tilted projection beam.

4. The exposure apparatus according to claim 3, wherein the tilting device includes a pattern comprising a first portion and a second portion,. the first portion being arranged to generate a first set of positive and negative diffraction orders and the second portion being arranged to generate a second set of positive and negative diffraction orders, and wherein the tilting device is further configured to block the first set of positive diffraction orders and the second set of negative diffraction orders.

5. The exposure apparatus according to claim 1, wherein the tilting device is provided with a pattern that includes a first pattern extending in a first direction and a second pattern extending in a second direction, the first and second directions being substantially perpendicular with respect to each other and being both substantially perpendicular with respect to the projection beam.

6. The exposure apparatus according to claim 5, wherein the projection beam is diffracted into a plurality of diffraction orders and the plurality of diffraction orders are provided in different locations in the pupil plane of the projection system and wherein the tilting device is arranged to block predetermined diffraction orders using a first structure and predetermined diffraction orders using a second structure.

7. The exposure apparatus according to claim 1, where the exposure apparatus is a lithographic apparatus and the target object is a substrate.

8. A tilting device for providing a projection beam with a tilt for use in an exposure apparatus that includes an illumination system for providing a projection beam of radiation, a support structure for supporting a patterning device that is provided with a pattern, the patterning device serving to impart the projection beam with a patterned cross-section, a table for holding a target object, and a projection system for projecting the patterned beam onto the target object, the tilting device being provided substantially in a pupil plane of the projection system and comprising:
   a pattern comprising a first portion configured to generate a first set of positive and negative diffraction orders and a second portion configured to generate a second, set of positive and negative diffraction orders, wherein the tilting device is further configured to block the first set of positive diffraction orders and the second set of negative diffraction orders.

9. The tilting device according to claim 8, wherein the first portion includes a first pattern extending in a first direction and the second portion includes a second pattern extending in a second direction, the first and second directions being substantially perpendicular with respect to each other and being both substantially perpendicular with respect to the projection beam.

* * * * *